United States Patent
Bang

(10) Patent No.: US 9,105,589 B2
(45) Date of Patent: Aug. 11, 2015

(54) ORGANIC LIGHT EMITTING DIODE DISPLAY

(71) Applicant: Samsung Display Co., Ltd., Yongin, Gyeonggi-Do (KR)

(72) Inventor: Hyun-Chol Bang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/295,214

(22) Filed: Jun. 3, 2014

(65) Prior Publication Data

US 2015/0170563 A1    Jun. 18, 2015

(30) Foreign Application Priority Data

Dec. 18, 2013    (KR) .......................... 10-2013-0158198

(51) Int. Cl.
*H01L 35/24*    (2006.01)
*H01L 51/00*    (2006.01)
*H01L 27/32*    (2006.01)

(52) U.S. Cl.
CPC .............. *H01L 27/32* (2013.01); *H01L 27/3262* (2013.01)

(58) Field of Classification Search
CPC ............................ H01L 27/3262; H01L 27/32
USPC ........................................................ 257/40
See application file for complete search history.

(56) References Cited

U.S. PATENT DOCUMENTS

| 8,378,931 | B2 | 2/2013 | Kim et al. | |
| 2008/0036704 | A1* | 2/2008 | Kim et al. | 345/76 |
| 2012/0248435 | A1* | 10/2012 | Koyama | 257/43 |

FOREIGN PATENT DOCUMENTS

| JP | 2013-113868 A | 6/2013 |
| KR | 10-2010-0043785 A | 4/2010 |
| KR | 10-2012-0075040 A | 7/2012 |

* cited by examiner

*Primary Examiner* — Theresa T Doan
(74) *Attorney, Agent, or Firm* — Christie, Parker & Hale, LLP

(57) ABSTRACT

An organic light emitting diode display includes a substrate, a scan line and a previous scan line formed on the substrate, a data line and a driving voltage line crossing the scan line and the previous scan line, a switching transistor coupled to the scan line and the data line, a driving transistor coupled to the switching transistor, a compensation transistor coupled to one end of the driving transistor and configured to compensate a threshold voltage of the driving transistor, a connecting member configured to couple a compensation semiconductor layer of the compensation transistor to a driving gate electrode of the driving transistor, a first electrode coupled to another end of the driving transistor, an organic emission layer on the first electrode, and a second electrode on the organic emission layer. The connecting member and the first electrode are spaced from each other on a planar surface of the substrate.

8 Claims, 7 Drawing Sheets

ORGANIC LIGHT EMITTING DIODE DISPLAY

CROSS-REFERENCE TO RELATED APPLICATION

This application claims priority to and the benefit of Korean Patent Application No. 10-2013-0158198 filed in the Korean Intellectual Property Office on Dec. 18, 2013, the entire disclosure of which is incorporated herein by reference.

BACKGROUND

1. Field

Aspects of embodiments of the present disclosure are directed to an organic light emitting diode display.

2. Description of the Related Art

An organic light emitting diode display includes two electrodes and an organic emission layer interposed between the two electrodes. Electrons injected from one electrode and holes injected from the other electrode are combined with each other in the organic emission layer to form excitons. Light is emitted while the excitons discharge energy.

The organic light emitting diode display includes a plurality of pixels including organic light emitting diodes which are self-light emitting elements. A plurality of transistors and storage capacitors for driving the organic light emitting diodes are formed in each pixel. The plurality of transistors generally includes a switching transistor and a driving transistor.

The driving transistor controls a driving current flowing to the organic light emitting diode. The storage capacitor coupled to (e.g., connected to) a gate node of the driving transistor stores a data voltage and maintains the stored data voltage for one frame. Accordingly, a predetermined quantity of driving current is supplied from the driving transistor to the organic light emitting diode for one frame to emit light.

However, a change in a voltage of an anode of the organic light emitting diode influences a voltage of the gate node of the driving transistor due to parasitic capacitance formed between the gate node of the driving transistor and the anode of the organic light emitting diode.

Accordingly, the change in the voltage of the gate node of the driving transistor changes the driving current flowing in the organic light emitting diode, so that luminance cannot be uniformly maintained independently of the change in a voltage of a cathode, and the luminance is changed according to a change in the voltage of the cathode.

Accordingly, in order to reduce power consumption, luminance and color may be changed when the voltage of the cathode is changed.

The above information disclosed in this Background section is only for enhancement of understanding of the background of the disclosure and, therefore, may contain information that does not form the prior art that is known to a person of ordinary skill in the art.

SUMMARY

Aspects of embodiments of the present disclosure are directed to an organic light emitting diode display capable of uniformly maintaining luminance and color, and reducing power consumption by adjusting a common voltage.

An example embodiment of the present disclosure provides an organic light emitting diode display, including: a substrate; a scan line and a previous scan line on the substrate and configured to transmit a scan signal and a previous scan signal, respectively; a data line and a driving voltage line crossing the scan line and the previous scan line, and configured to transmit a data signal and a driving voltage, respectively; a switching transistor coupled to the scan line and the data line; a driving transistor coupled to the switching transistor; a compensation transistor coupled to one end of the driving transistor and configured to turn on according to the scan signal to compensate a threshold voltage of the driving transistor; a connecting member configured to couple a compensation semiconductor layer of the compensation transistor to a driving gate electrode of the driving transistor; a first electrode coupled to another end of the driving transistor; an organic emission layer on the first electrode; and a second electrode on the organic emission layer. The connecting member and the first electrode are spaced from each other on a planar surface of the substrate.

An outer line of the connecting member and an outer line of the first electrode facing the outer line of the connecting member in the planar surface may have an interval therebetween.

The organic light emitting diode display may further include: a switching semiconductor layer and a driving semiconductor layer at a same layer as that of the compensation semiconductor layer; and a first gate insulating layer, a second gate insulating layer, and an interlayer insulating layer sequentially covering the switching semiconductor layer, the driving semiconductor layer, and the compensation semiconductor layer. The connecting member may be on the interlayer insulating layer.

The organic light emitting diode display may further include a storage capacitor including: a first storage capacitive plate on the first gate insulating layer and overlapping the driving semiconductor layer; and a second storage capacitive plate on the second gate insulating layer and overlapping the first storage capacitive plate. The first storage capacitive plate may include the driving gate electrode.

The data line and the driving voltage line may be at a same layer as the connecting member.

One end of the connecting member may be coupled to the driving gate electrode through a contact hole formed in the second gate insulating layer and the interlayer insulating layer, and another end of the connecting member may be coupled to the compensation semiconductor layer through a contact hole in the first gate insulating layer, the second gate insulating layer, and the interlayer insulating layer.

The organic light emitting diode display may further include: a passivation layer configured to cover the data line, the driving voltage line, and the connecting member; a pixel defining layer configured to cover an edge of the first electrode on the passivation layer; and an initialization voltage line at a same layer as that of the first electrode, and configured to initialize the driving transistor. The second storage capacitive plate may be located between the driving gate electrode and the first electrode, the second storage capacitive plate covering the driving gate electrode.

The organic light emitting diode display may further include: an initialization transistor configured to turn on according to the previous scan signal, and configured to transmit the initialization voltage to the driving gate electrode; a light emission control line at a same layer as that of the scan line and configured to transmit a light emission control signal; an operation control transistor configured to turn on by the light emission control signal and configured to transmit the driving voltage to the driving transistor; and a light emission control transistor configured to turn on by the light emission control signal and configured to transmit the driving voltage from the driving transistor to the first electrode. A light emission control drain electrode of the light emission control transistor may overlap an extended portion of the first electrode.

According to the example embodiments of the present disclosure, the connecting member and the pixel electrode may have a planar interval, and thus, may not overlap each other so that a parasitic capacitance between the connecting member and the pixel electrode may not be substantially generated.

Accordingly, even when the common voltage ELVSS is changed, a magnitude of the driving current flowing in the organic light emitting diode may be barely changed, so it may be possible to uniformly maintain luminance and a color, and to reduce power consumption by changing the common voltage.

DETAILED DESCRIPTION

Figure 1:
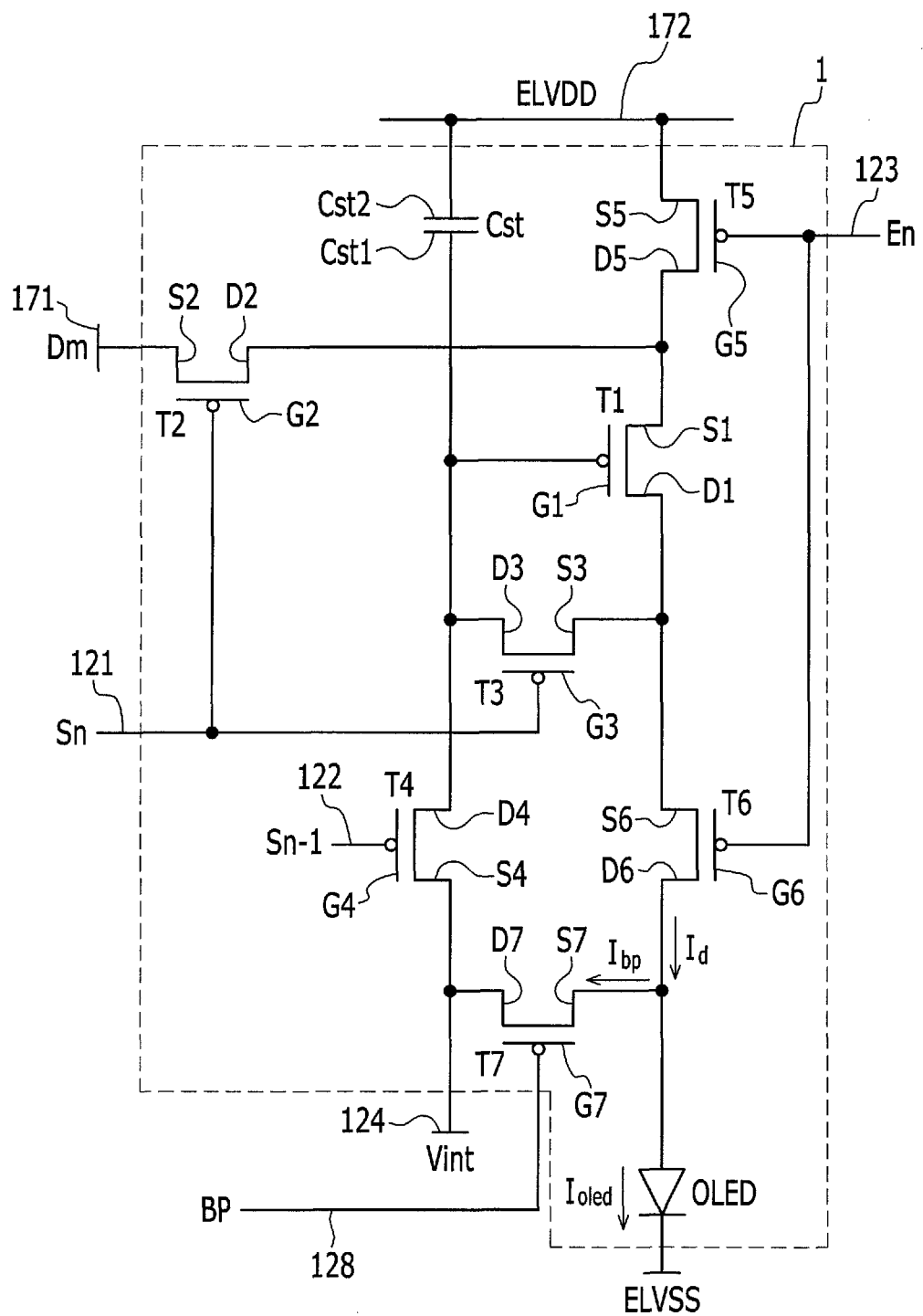
FIG. 1 is an equivalent circuit diagram of one pixel of an organic light emitting diode display according to an example embodiment of the present disclosure.

Aspects of embodiments of the present disclosure will be described hereinafter with reference to the accompanying drawings, in which example embodiments are shown. As those skilled in the art would realize, the described embodiments may be modified in various different ways, all without departing from the spirit or scope of the present disclosure.

Some of the elements and functions that are not necessary for a full understanding of the present description have been omitted to clearly describe the present disclosure, and the same elements have been designated by the same reference numerals throughout the specification.

In addition, the size and thickness of each configuration shown in the drawings are arbitrarily shown for understanding and ease of description, but the present disclosure is not limited thereto.

In the drawings, the thickness of layers, films, panels, regions, etc., are exaggerated for clarity. In the drawings, for understanding and ease of description, the thickness of some layers and areas are exaggerated. It will be understood by a person of ordinary skill in the art that when an element such as a layer, film, region, or substrate is referred to as being "on" another element, it can be directly on the other element or one or more intervening elements may also be present.

In addition, unless explicitly described to the contrary, the word "comprise," and variations such as "comprises" or "comprising," will be understood to imply the inclusion of the stated elements but not the exclusion of any other elements.

Further, in the specification, the word "on" means positioning on or below the object portion, but does not necessarily mean positioning on the upper side of the object portion based on a gravity direction.

Further, in the specification, the phrase "on a flat surface" is used to mean that an object portion is viewed from the above, and the phrase "on a cross section" is used to mean that a cross section taken by vertically cutting an object portion is viewed from the side.

An organic light emitting diode display according to embodiments of the present disclosure will be described in detail with reference to FIGS. 1 to 7.

FIG. 1 is an equivalent circuit diagram of one pixel of an organic light emitting diode display according to an example embodiment of the present disclosure.

As illustrated in FIG. 1, one pixel 1 of the organic light emitting diode display according to an example embodiment includes a plurality of signal lines 121, 122, 123, 124, 128, 171, and 172, a plurality of transistors T1, T2, T3, T4, T5, T6, and T7 coupled to (e.g., connected to) the plurality of signal lines, a storage capacitor Cst, and an organic light emitting diode OLED.

The plurality of transistors includes a driving transistor (driving thin film transistor) T1, a switching transistor (switching thin film transistor) T2, a compensation transistor T3, an initialization transistor T4, an operation control transistor T5, a light emission control transistor T6, and a bypass transistor T7.

The plurality of signal lines includes a scan line 121 for transmitting a scan signal Sn, a previous scan line 122 for transmitting a previous scan signal Sn-1 to the initialization transistor T4, a light emission control line 123 for transmitting a light emission control signal En to the operation control transistor T5 and the light emission control transistor T6, an initialization voltage line 124 for transmitting an initialization voltage Vint for initializing the driving transistor T1, a bypass control line 128 for transmitting a bypass signal BP to the bypass transistor T7, a data line 171 crossing the scan line 121 to transmit a data signal Dm, and a driving voltage line 172 formed substantially in parallel to the data line 171 to transmit a driving voltage ELVDD.

A gate electrode G1 of the driving transistor T1 is coupled to one end Cst1 of the storage capacitor Cst, a source electrode S1 of the driving transistor T1 is coupled to the driving voltage line 172 via the operation control transistor T5, and the drain electrode D1 of the driving transistor T1 is electrically coupled (e.g., electrically connected) to an anode of the organic light emitting diode OLED via the light emission control transistor T6. The driving transistor T1 receives the data signal Dm according to a switching operation of the switching transistor T2, to supply a driving current $I_d$ to the organic light emitting diode OLED.

A gate electrode G2 of the switching transistor T2 is coupled to the scan line 121, a source electrode S2 of the switching transistor T2 is coupled to the data line 171, and a drain electrode D2 of the switching transistor T2 is coupled to the driving voltage line 172 via the operation control transistor T5 and coupled to the source electrode S1 of the driving transistor T1. The switching transistor T2 is turned on according to the scan signal Sn received through the scan line 121, to perform the switching operation of transmitting the data signal Dm transmitted to the data line 171 to the source electrode of the driving transistor T1.

A gate electrode G3 of the compensation transistor T3 is coupled to (e.g., directly connected to) the scan line 121, a source electrode S3 of the compensation transistor T3 is coupled to an anode of the organic light emitting diode OLED via the light emission control transistor T6 and coupled to the drain electrode D1 of the driving transistor T1, and a drain electrode D3 of the compensation transistor T3 is coupled to the one end Cst1 of the storage capacitor Cst, to a drain electrode D4 of the initialization transistor T4, and to the gate electrode G1 of the driving transistor T1. The compensation transistor T3 is turned on according to the scan signal Sn received through the scan line 121 to diode-couple (e.g., diode-connect) the driving transistor T1 by coupling the gate electrode G1 to the drain electrode D1 of the driving transistor T1.

A gate electrode G4 of the initialization transistor T4 is coupled to the previous scan line 122, the source electrode S4 of the initialization transistor T4 is coupled to the initialization voltage line 124, and the drain electrode D4 of the initialization transistor T4 is coupled to the one end Cst1 of the storage capacitor Cst, to the drain electrode D3 of the compensation transistor T3, and to the gate electrode G1 of the driving transistor T1. The initialization transistor T4 is turned on according to the previous scan signal Sn-1 received through the previous scan line 122 to transmit the initialization voltage Vint to the gate electrode G1 of the driving transistor T1, and to perform an initialization operation of initializing the voltage of the gate electrode G1 of the driving transistor T1.

A gate electrode G5 of the operation control transistor T5 is coupled to the light emission control line 123, a source electrode S5 of the operation control transistor T5 is coupled to the driving voltage line 172, and a drain electrode D5 of the operation control transistor T5 is coupled to the source electrode S1 of the driving transistor T1 and to the drain electrode S2 of the switching transistor T2.

A gate electrode G6 of the light emission control transistor T6 is coupled to the light emission control line 123, a source electrode S6 of the light emission control transistor T6 is coupled to the drain electrode D1 of the driving transistor T1 and to the source electrode S3 of the compensation transistor T3, and a drain electrode D6 of the light emission control transistor T6 is electrically coupled to the anode of the organic light emitting diode (OLED). The operation control transistor T5 and the light emission control transistor T6 are concurrently (e.g., simultaneously) turned on according to the light emission control signal En received through the light emission control line 123, to transmit the driving voltage ELVDD to the organic light emitting diode OLED, and thus, the driving current $I_d$ flows in the organic light emitting diode OLED.

A gate electrode G7 of the bypass transistor T7 is coupled to the bypass control line 128, a source electrode S7 of the bypass transistor T7 is coupled to both the drain electrode D6 of the light emission control thin film transistor T6 and the anode of the organic light emitting diode OLED, and a drain electrode D7 of the bypass transistor T7 is coupled to both the initialization voltage line 124 and the source electrode S4 of the initialization transistor T4.

The other end Cst2 of the storage capacitor Cst is coupled to the driving voltage line 172, and a cathode of the organic light emitting diode OLED is coupled to a common voltage ELVSS. Accordingly, the organic light emitting diode OLED displays an image by receiving the driving current $I_d$ from the driving transistor T1 to emit light.

Hereinafter, an operation process of one pixel of the organic light emitting diode display according to an example embodiment of the present disclosure will be described.

First, the previous scan signal Sn-1 at a low level is supplied through the previous scan line 122 during an initialization period. Then, the initialization transistor T4 is turned on in response to the prior scan signal Sn-1 at the low level, and the initialization voltage Vint transmitted from the initialization voltage line 124 through the initialization transistor T4 is coupled to the gate electrode of the driving transistor T1. Thus, the driving transistor T1 is initialized by the initialization voltage Vint.

Subsequently, the scan signal Sn at the low level is supplied through the scan line 121 during a data programming period. Then, the switching transistor T2 and the compensation transistor T3 are turned on in response to the scan signal Sn at the low level.

The driving transistor T1 is diode-coupled by the turned-on compensation transistor T3, and is biased in a forward direction.

Then, a compensation voltage Dm+Vth (Vth is a negative value) obtained by subtracting a threshold voltage Vth of the driving transistor T1 from the data signal Dm supplied from the data line 171 is applied to the gate electrode of the driving transistor T1.

The driving voltage ELVDD and the compensation voltage Dm+Vth are applied to respective ends of the storage capacitor Cst, and a charge corresponding to a difference between the voltages at the ends is stored in the storage capacitor Cst. Then, the light emission control signal En supplied from the light emission control line 123 during the light emission period is changed from a high level to the lower level. Then, the operation control transistor T5 and the light emission control transistor T6 are turned on by the light emission control signal En at the low level during the light emission period.

Then, the driving current $I_d$ is generated according to a difference between the voltage of the gate electrode of the driving transistor T1 and the driving voltage ELVDD, and the driving current $I_d$ is supplied to the organic light emitting diode OLED through the light emission control transistor T6. A gate-source voltage Vgs of the driving transistor T1 is maintained at '(Dm+Vth)-ELVDD' by the storage capacitor Cst during the light emission period, and the driving current $I_d$ is proportional to a square of a value obtained by subtracting the threshold voltage from a source-gate voltage, that is, "(Dm-ELVDD)$^2$", according to a current-voltage relationship of the driving transistor T1. Accordingly, the driving current $I_d$ is determined regardless of the threshold voltage Vth of the driving transistor T1.

In this case, the bypass transistor T7 receives the bypass signal BP from the bypass control line 128. The bypass signal BP is a voltage of a set (e.g., predetermined) level at which the bypass transistor T7 may maintain a turned off state. The bypass transistor T7 receives the voltage to maintain the turned off state at the gate electrode G7, so that the bypass transistor T7 remains turned off and a part of the driving current $I_d$ flows as a bypass current $I_{bp}$ through the bypass transistor T7 in the off state of the bypass transistor T7.

Accordingly, when the driving current for displaying a black image flows, a light emitting current $I_{oled}$ of the organic light emitting diode, which is reduced by a current amount of the bypass current $I_{bp}$ discharged from the driving current $I_d$ through the bypass transistor T7, may have a minimum current amount at a level at which the black image may be clearly displayed. Accordingly, a contrast ratio may be improved by implementing a precise black luminance image by using the bypass transistor T7.

An arrangement structure of the plurality of pixels of the organic light emitting diode display illustrated in FIG. 1 will be described with reference to FIG. 2.

Figure 2:
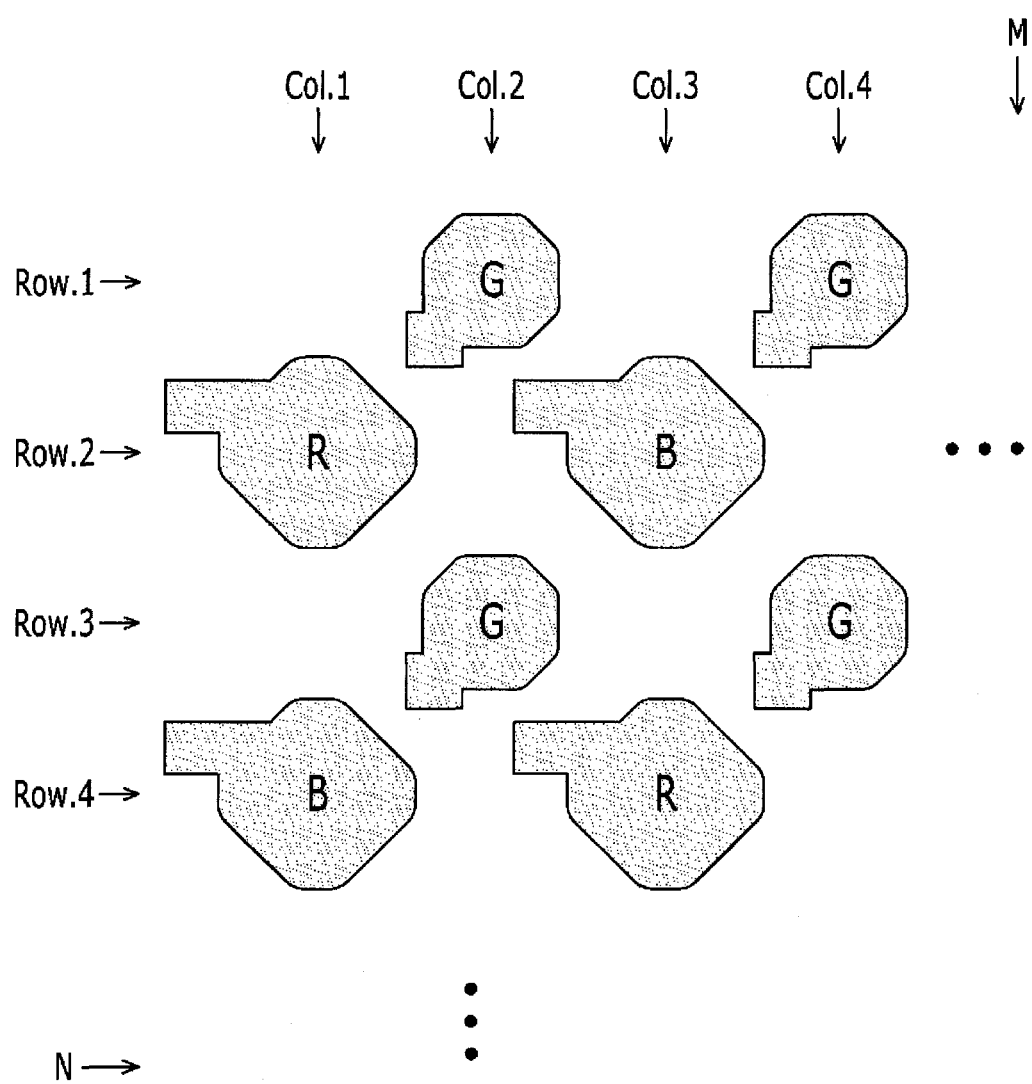
FIG. 2 is a layout view schematically illustrating a plurality of pixels of the organic light emitting diode display according to an example embodiment of the present disclosure.

FIG. 2 is a layout view schematically illustrating the plurality of pixels of the organic light emitting diode display according to an example embodiment of the present disclosure.

As illustrated in FIG. 2, a plurality of green pixels G are positioned to be spaced apart from each other by a set (e.g., predetermined) interval in a first row 1. A red pixel R and a blue pixel B are alternately positioned in an adjacent second row 2. A plurality of green pixels G are positioned to be spaced apart from each other by a set (e.g., predetermined) interval in an adjacent third row 3. A blue pixel B and a red pixel R are alternately positioned in an adjacent fourth row 4. The arrangement of the pixels shown in FIG. 2 may be repeated up to an $N^{th}$ row, where N is a positive integer.

The plurality of green pixels G positioned in the first row 1 and the plurality of red pixels R and blue pixels B positioned in the second row 2 are alternately positioned. Accordingly, the red pixel R and the blue pixel B are alternately positioned in a first column 1. The plurality of green pixels G are positioned to be spaced apart from each other by a set interval in an adjacent second column 2. The blue pixel B and the red pixel R are alternately positioned in an adjacent third column 3. The plurality of green pixels G are positioned to be spaced apart from each other by a set interval in an adjacent fourth column 4. The disposition of the pixels shown in FIG. 2 may be repeated up to an Mtn column, where M is a positive integer.

The above-described pixel arrangement structure is referred to as a pentile matrix, and high definition may be implemented with a small number of pixels by applying a rendering operation, in which adjacent pixels are shared to express colors.

A structure of the pixel of the organic light emitting diode display illustrated in the example embodiment of FIG. 1 will be described with reference to FIGS. 3 to 7 together with FIG. 1.

Figure 3:
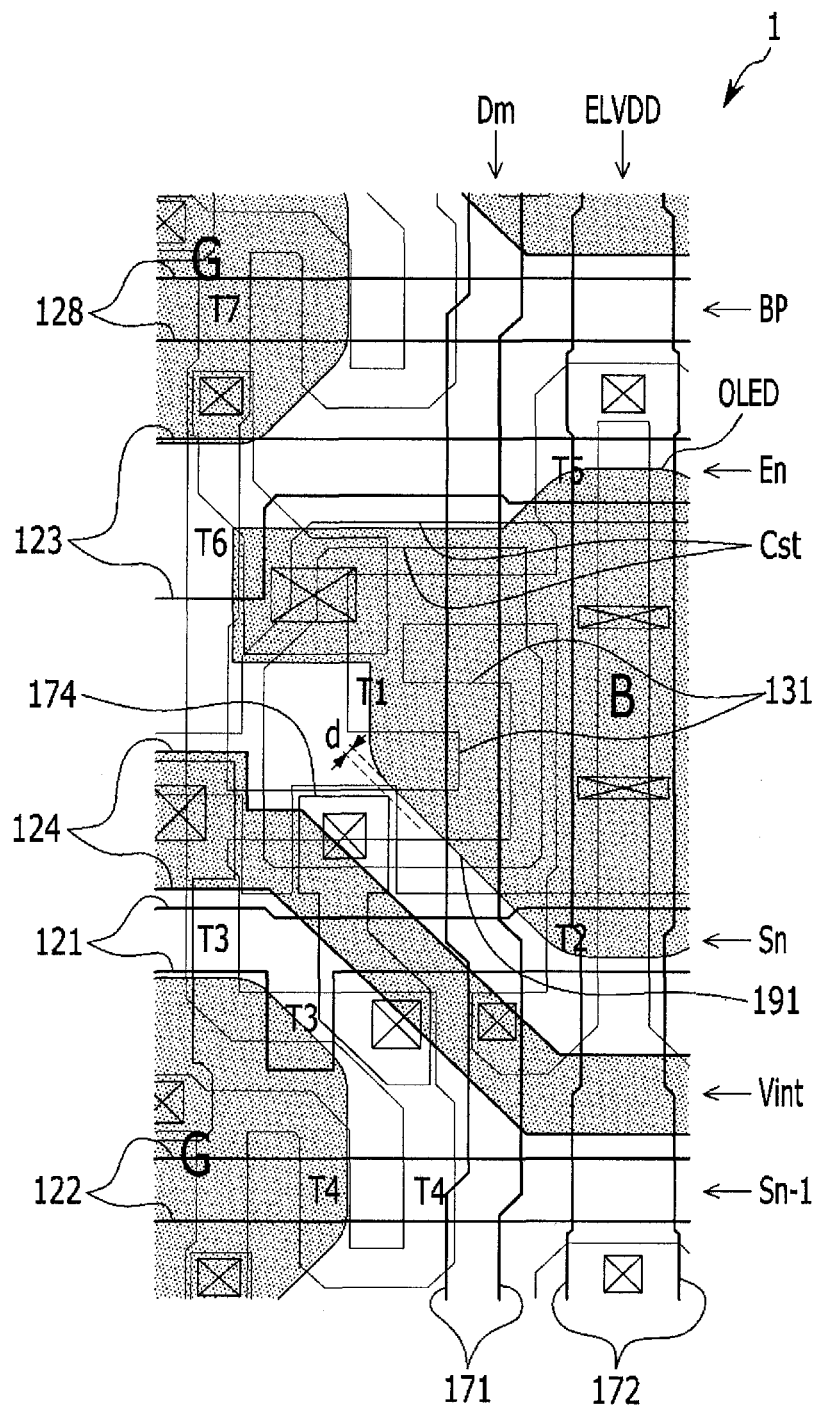
FIG. 3 is a view schematically illustrating a plurality of transistors and a capacitor of the organic light emitting diode display according to an example embodiment of the present disclosure.
Figure 4:
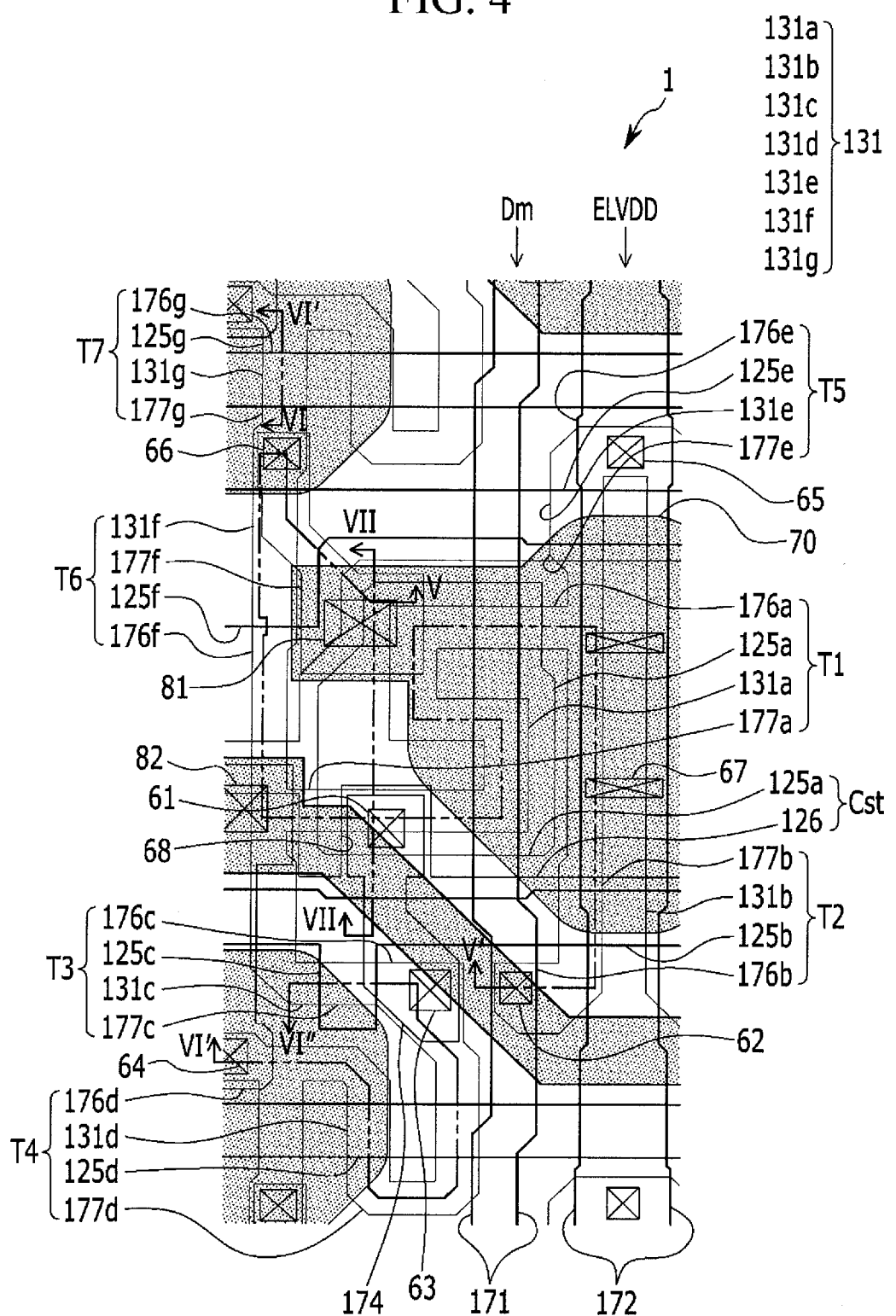
FIG. 4 is a layout view of the example embodiment shown in FIG. 3.
Figure 5:
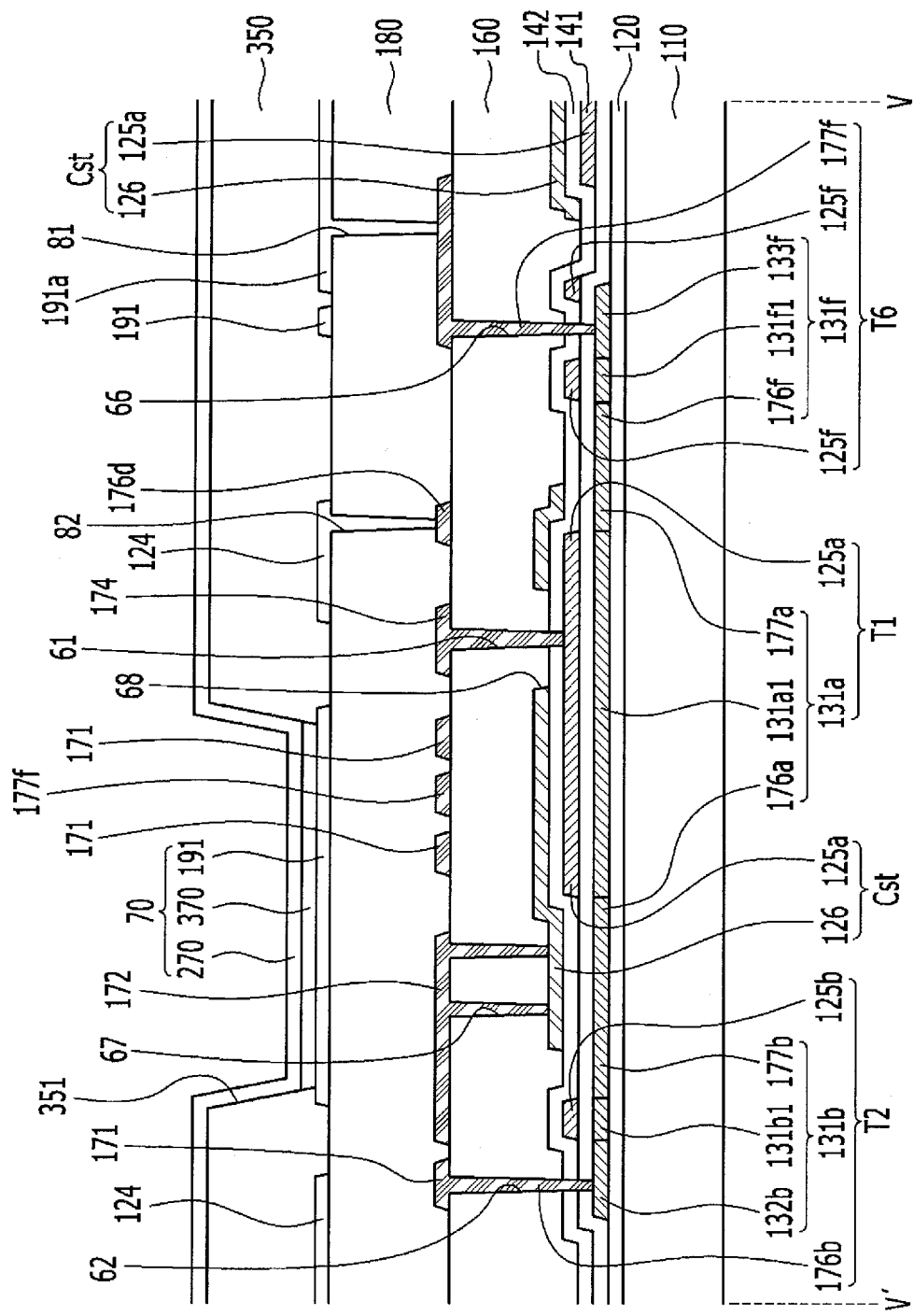
FIG. 5 is a cross-sectional view of the organic light emitting diode display of FIG. 4 taken along the line V-V.
Figure 6:
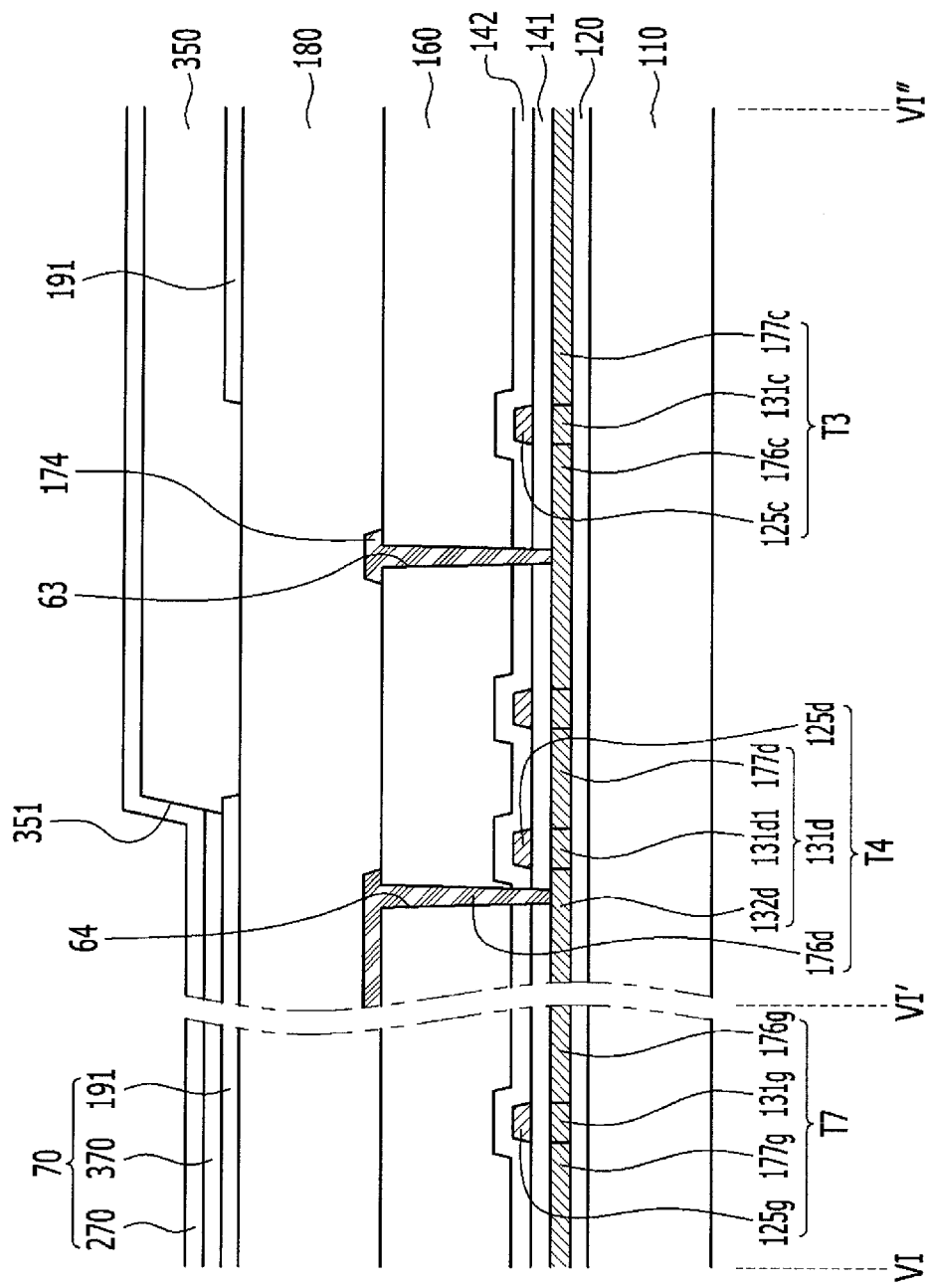
FIG. 6 is a cross-sectional view of the organic light emitting diode display of FIG. 4 taken along the lines VI-VI' and VI'-VI".
Figure 7:
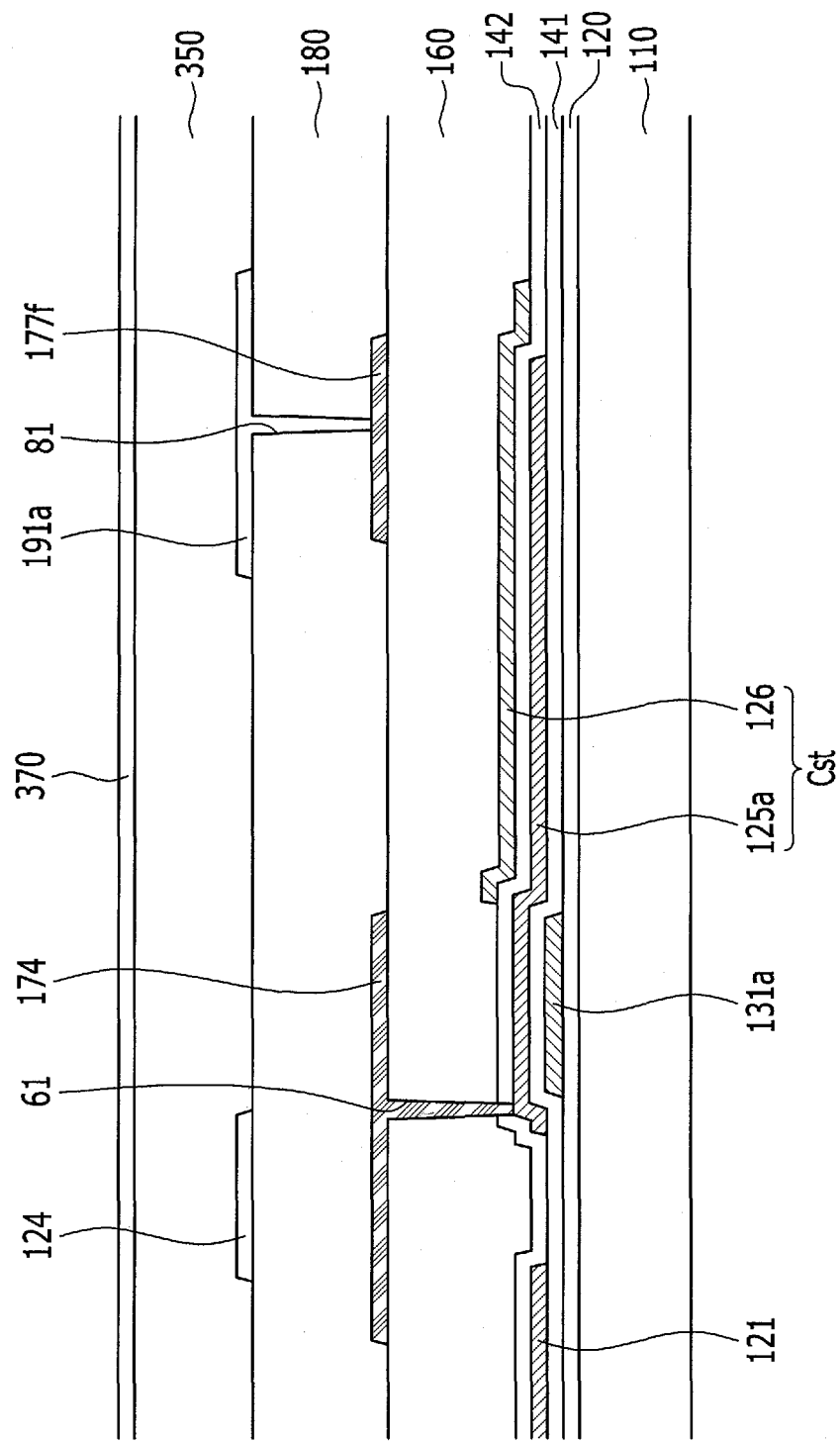
FIG. 7 is a cross-sectional view of the organic light emitting diode display of FIG. 4 taken along the line VII-VII.

FIG. 3 is a view schematically illustrating a plurality of transistors and capacitors of the organic light emitting diode display according to an example embodiment of the present disclosure. FIG. 4 is a layout view of the embodiment shown in FIG. 3. FIG. 5 is a cross-sectional view of the organic light emitting diode display of FIG. 4 taken along the line V-V'. FIG. 6 is a cross-sectional view of the organic light emitting diode display of FIG. 4 taken along the lines VI-VI' and VI'-VI''. FIG. 7 is a cross-sectional view of the organic light emitting diode display of FIG. 4 taken along the line VII-VII.

As illustrated in FIG. 3, the organic light emitting diode display according to an example embodiment includes the scan line 121, the previous scan line 122, the light emission control line 123, and the bypass control line 128 formed in a row direction, and configured to supply the scan signal Sn, the previous scan signal Sn-1, the light emission control signal En, and the bypass signal BP, respectively. The organic light emitting diode display further includes the data line 171 and the driving voltage line 172 crossing the scan line 121, the previous scan line 122, the light emission control line 123, and the bypass control line 128, and applying the data signal Dm and the driving voltage EVLDD to the pixel, respectively. The initialization voltage Vint is transmitted to the driving transistor T1 through the initialization voltage line 124 via the initialization transistor T4.

Further, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED are formed in the pixel.

The driving transistor T1, the switching transistor T2, the compensation transistor T3, the initialization transistor T4, the operation control transistor T5, the light emission control transistor T6, and the bypass transistor T7 are formed along a semiconductor layer 131, and the semiconductor layer 131 is formed to be bent in various shapes. The semiconductor layer 131 may be formed of polysilicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In the case where the semiconductor layer 131 is formed of the oxide semiconductor, a separate passivation layer may be additionally formed to protect the oxide semiconductor from an external environment, for example, a high temperature environment.

The semiconductor layer 131 includes a channel region which is subjected to channel doping with an N-type impurity or a P-type impurity, and a source region and a drain region which are formed at both sides of the channel region by doping a doping impurity having a type opposite to that of the doping impurity doped in the channel region.

Hereinafter, a specific planar structure of the organic light emitting diode display according to the example embodiments described above will be first described with reference to FIGS. 3 and 4, and cross-sectional structures thereof will be described with reference to FIGS. 5 to 7.

First, as illustrated in FIGS. 3 and 4, the pixel 1 of the organic light emitting diode display according to the example embodiment includes the driving transistor T1, the switching transistor T2, the compensation transistor T3, the initialization transistor T4, the operation control transistor T5, the light emission control transistor T6, the bypass transistor, T7, the storage capacitor Cst, and the organic light emitting diode OLED. The transistors T1, T2, T3, T4, T5, T6, and T7 are formed along the semiconductor layer 131. The semiconductor layer 131 includes a driving semiconductor layer 131a formed in the driving transistor T1, a switching semiconductor layer 131b formed in the switching transistor T2, a compensation semiconductor layer 131c formed in the compensation transistor T3, an initialization semiconductor layer 131d formed in the initialization transistor T4, an operation control semiconductor layer 131e formed in the operation control transistor T5, a light emission control semiconductor layer 131f formed in the light emission control transistor T6, and a bypass semiconductor layer 131g formed in the bypass transistor T7.

The driving transistor T1 includes the driving semiconductor layer 131a, a driving gate electrode 125a, a driving source electrode 176a, and a driving drain electrode 177a.

The driving semiconductor layer 131a is bent, and may have an oblique shape or a zigzag shape. The elongated driving semiconductor layer 131a may be formed within a small space by forming the driving semiconductor layer 131a having the bent shape. Accordingly, because a driving channel region 131a1 of the driving semiconductor layer 131a may be formed to be long, a driving range of the gate voltage applied to the driving gate electrode 125a is broadened. Therefore, because the driving range of the gate voltage is broad, a gray level of light emitted from an organic light emitting diode OLED may be finely controlled by changing the magnitude of the gate voltage, and as a result, it may be possible to increase resolution of the organic light emitting diode display and to improve a display quality. Various embodiments, for example, a shape of "inverse S", a shape of "S", a shape of "M", and a shape of "W" of the driving semiconductor layer 131a, may be carried out by modifying the shape of the driving semiconductor layer 131a.

The driving source electrode 176a corresponds to a driving source region 176a doped with the impurity in the driving semiconductor layer 131a, and the driving drain electrode 177a corresponds to a driving drain region 177a doped with the impurity in the driving semiconductor layer 131a. The driving gate electrode 125a overlaps the driving semiconductor layer 131a. The driving gate electrode 125a is formed of the same material as that of the scan line 121, the previous scan line 122, the light emission control line 123, the switching gate electrode 125b, the compensation gate electrode 125c, the initialization gate electrode 125d, the operation control gate electrode 125e, and the light emission control gate electrode 125f formed on the same layer.

The switching transistor T2 includes the switching semiconductor layer 131b, the switching gate electrode 125b, a switching source electrode 176b, and a switching drain electrode 177b. The switching gate electrode 125b is a part of the scan line 121.

The switching source electrode 176b, which is a part of the data line 171, is coupled (e.g., connected) to a switching source region 132b doped with the impurity in the switching semiconductor layer 131b, and the switching drain electrode 177b corresponds to a switching drain region 177b doped with the impurity in the switching semiconductor layer 131b.

The compensation transistor T3 includes the compensation semiconductor layer 131c, the compensation gate electrode 125c, a compensation source electrode 176c, and a compensation drain electrode 177c. The compensation source electrode 176c corresponds to a compensation source region 176c doped with the impurity in the compensation semiconductor layer 131c, and the compensation drain electrode 177c corresponds to a compensation drain region 177c doped with the impurity in the compensation semiconductor layer 131c.

The initialization transistor T4 includes the initialization semiconductor layer 131d, the initialization gate electrode 125d, an initialization source electrode 176d, and an initialization drain electrode 177d. The initialization drain electrode 177d corresponds to the initialization drain region 177d doped with the impurity. The initialization source electrode 176d is coupled to the initialization source region 132d doped with the impurity in the initialization semiconductor layer 131d through a contact hole 64. The initialization voltage line 124 is coupled to the initialization source electrode 176d through a contact hole 82. The initialization voltage line 124 is coupled to the initialization semiconductor layer 131d through the initialization source electrode 176d.

The operation control transistor T5 includes the operation control semiconductor layer 131e, the operation control gate electrode 125e, an operation control source electrode 176e, and an operation control drain electrode 177e. The operation control source electrode 176e, which is a part of the driving voltage line 172, is coupled to the operation control semiconductor layer 131e, and the operation control drain electrode 177e corresponds to an operation control drain region 177e doped with the impurity in the operation control semiconductor layer 131e.

The light emission control transistor T6 includes the light emission control semiconductor layer 131f, the light emission control gate electrode 125f, a light emission control source electrode 176f, and a light emission drain electrode 177f. The light emission control source electrode 176f corresponds to the light emission control source region 176f doped with the impurity in the light emission control semiconductor layer 131f, and the light emission control drain electrode 177f is coupled to the light emission control drain region 133f of the light emission control semiconductor layer 131f.

The bypass transistor T7 includes the bypass semiconductor layer 131g, the bypass gate electrode 125g, a bypass source electrode 176g, and a bypass drain electrode 177g. The bypass source electrode 176g corresponds to a bypass source region 176g doped with the impurity in the bypass semiconductor layer 131g, and the bypass drain electrode 177g corresponds to a bypass drain region 177g doped with the impurity in the bypass semiconductor layer 131g. The bypass source electrode 176g is coupled to (e.g., directly connected to) the light emission control drain region 133f.

One end of the driving semiconductor layer 131a of the driving transistor T1 is coupled to the switching semiconductor layer 131b and to the operation control semiconductor layer 131e. The other end of the driving semiconductor layer 131a is coupled to the compensation semiconductor layer 131c and to the light emission control semiconductor layer 131f. Accordingly, the driving source electrode 176a is coupled to the switching drain electrode 177b and to the operation control drain electrode 177e. The driving drain electrode 177a is coupled to the compensation source electrode 176c and to the light emission control source electrode 176f.

The storage capacitor Cst includes a first storage capacitive plate 125a and a second storage capacitive plate 126 with the second gate insulating layer 142 interposed therebetween. The first storage capacitive plate 125a serves as the driving gate electrode 125a, the second gate insulating layer 142 includes a dielectric material, and storage capacitance is determined by the charge accumulated in the storage capacitor Cst and the voltage between both capacitive plates 125a and 126.

A connecting member 174 is formed to be parallel on the same layer as that of the data line 171, and couples the driving gate electrode 125a to the compensation drain electrode 177c of the compensation thin film transistor T3. The first storage capacitive plate 125a, which is the driving gate electrode 125a, is coupled to one end of the connecting member 174, and the compensation drain electrode 177c is coupled to the other end of the connecting member 174 in the compensation semiconductor layer 131c.

Accordingly, the storage capacitor Cst stores a storage capacitance corresponding to a difference between the driving voltage ELVDD transmitted to the second storage capacitive plate 126 through the driving voltage line 172 and the gate voltage of the driving gate electrode 125a.

The switching transistor T2 is used as a switching element for selecting a desired pixel to emit light. The switching gate electrode 125b is coupled to the scan line 121, the switching source electrode 176b is coupled to the data line 171, and the switching drain electrode 177b is coupled to the driving transistor T1 and to the operation control transistor T5. Further, the light emission drain electrode 177f of the light emission control transistor T6 is coupled to (e.g., directly connected to) the pixel electrode 191, which is a first electrode of the organic light emitting diode 70.

In this case, the connecting member 174 has a planar distance d from the pixel electrode 191. That is, an outer line of the connecting member 174 and an outer line of the pixel electrode 191 facing an outer line of the connecting member 174 in a planar surface of the substrate have the distance d. Accordingly, the connecting member 174 does not overlap the pixel electrode 191, so that parasitic capacitance is not generated between the connecting member 174 and the pixel electrode 191.

Accordingly, the change in the voltage of the organic light emitting diode 70 is not influenced by the change in the voltage of the connecting member 174, so that when the common voltage ELVSS is changed, the magnitude of the driving current flowing in the organic light emitting diode 70 is barely changed (e.g., substantially unchanged). Accordingly, it is possible to uniformly maintain luminance and a color of the organic light emitting diode 70, and to reduce power consumption by changing the common voltage by using the aforementioned characteristic.

Hereinafter, a stacking sequence in the structure of the organic light emitting diode display according to the example embodiment will be described in detail with reference to FIGS. 5 to 7.

A stacking structure of the operation control transistor T5 is substantially the same as a stacking structure of the light emission control transistor T6, so that a detailed description thereof will be omitted.

A buffer layer 120 is formed on the substrate 110, and the substrate 110 may be formed of an insulating substrate made of glass, quartz, ceramics, plastics or the like.

The driving semiconductor layer 131a, the switching semiconductor layer 131b, the compensation semiconductor layer 131c, the initialization semiconductor layer 131d, the operation control semiconductor layer 131e, the light emission control semiconductor layer 131f, and the bypass semiconductor layer 131g are formed on the buffer layer 120.

The driving semiconductor layer 131 includes the driving channel region 131a1, and the driving source region 176a and the driving drain region 177a facing each other with the driving channel region 131a1 interposed therebetween. The switching semiconductor layer 131b includes a switching channel region 131b1, and the switching source region 132b and the switching drain region 177b facing each other with the switching channel region 131b1 interposed therebetween. Further, the compensation semiconductor layer 131c includes a compensation channel region 131c, the compensation source region 176c, and the compensation drain region 177c. The initialization semiconductor layer 131d includes an initialization channel region 131d1, the initialization source region 132d, and the initialization drain region 177d. The light emission semiconductor layer 131f includes a light emission control channel region 131f1, the light emission control source region 176f, and the light emission control drain region 133f. The bypass semiconductor layer 131g includes a bypass channel region 131g, the bypass source region 176g, and the bypass drain region 177g.

A first gate insulating layer 141 is formed on the driving semiconductor layer 131a, the switching semiconductor layer 131b, the compensation semiconductor layer 131c, the initialization semiconductor layer 131d, the operation control semiconductor layer 131e, the light emission control semiconductor layer 131f, and the bypass semiconductor layer 131g. Gate wiring 121, 122, 123, 125a, 125b, 125c, 125d, 125e, 125f, 125g, and 128, including the scan line 121 including the switching gate electrode 125b and the compensation gate electrode 125c, the previous scan line 122 including the initialization gate electrode 125d, the light emission control line 123 including the operation control gate electrode 125e and the light emission control gate electrode 125f, and a bypass line 128 including the driving gate electrode (first storage capacitive plate 125a) and the bypass gate electrode 125g, are formed on the first gate insulating layer 141.

A second gate insulating layer 142 is formed on the gate wiring 121, 122, 123, 125a, 125b, 125c, 125d, 125e, 125f, 125g, and 128 and the first gate insulating layer 141. The first gate insulating layer 141 and the second gate insulating layer 142 may be formed of silicon nitride (SiNx) or silicon oxide (SiO$_2$).

A second storage capacitive plate 126 overlapping the first storage capacitive plate 125a is formed on the second gate insulating layer 142. The second storage capacitive plate 126 is formed to be wider than the first storage capacitive plate 125a serving as the driving gate electrode, so that the second storage capacitive plate 126 covers or substantially covers the entire driving gate electrode 125a. Accordingly, the second storage capacitive plate 126 blocks or substantially blocks the change in the voltage of the driving gate electrode 125a from influencing the voltage of the pixel electrode 191 overlapping the driving gate electrode 125a.

An interlayer insulating layer 160 is formed on the second gate insulating layer 142 and the second storage capacitive plate 126. The interlayer insulating layer 160 may be formed of a ceramic-based material, such as silicon nitride (SiNx) or silicon oxide (SiO$_2$).

Data wiring 171, 172, 174, 176b, 176d, and 177f, including the data line 171 including the switching source electrode 176b, the driving voltage line 172, the connecting member 174, the initialization source electrode 176d, and the light emission control drain electrode 177f, are formed on the interlayer insulating layer 160.

The switching source electrode 176b is coupled to the switching source region 132b through a contact hole 62 formed in the first gate insulating layer 141, the second gate insulating layer 142, and the interlayer insulating layer 160. The driving voltage line 172 is coupled to the second storage capacitive plate 126 through a contact hole 67 formed in the interlayer insulating layer 160. The driving voltage line 172 is coupled to the operation control source electrode 176e through a contact hole 65 formed in the first gate insulating layer 141 and the second gate insulating layer 142. One end of the connecting member 174 is coupled to the driving gate electrode 125a through a contact hole 61 formed in the second gate insulating layer 142 and the interlayer insulating layer 160, and the other end of the connecting member 174 is coupled to the compensation semiconductor layer 176c through a contact hole 63 formed in the first gate insulating layer 141, the second gate insulating layer 142, and the interlayer insulating layer 160. The one end of the connecting member 174 is positioned inside a capacitive recess 68 formed in the second storage capacitive plate 126. Further, the initialization source electrode 176d is coupled to the initialization semiconductor layer 131d through the contact hole 64 formed in the first gate insulating layer 141, the second gate insulating layer 142, and the interlayer insulating layer 160. The light emission control drain electrode 177f is coupled to the light emission control semiconductor layer 131f through the contact hole 66 formed in the first gate insulating layer 141, the second gate insulating layer 142, and the interlayer insulating layer 160.

The passivation layer 180 covering the data wiring 171, 172, 174, 176b, 176d, and 177f is formed on the interlayer insulating layer 160, and the pixel electrode 191 and the initialization voltage line 124 are formed on the passivation layer 180. The light emission control drain electrode 177f is coupled to an extended portion 191a of the pixel electrode 191 through a contact hole 81 formed in the passivation layer 180. The initialization source electrode 176d is coupled to the initialization voltage line 124 through the contact hole 82 formed in the passivation layer 180.

A partition wall 350 is formed on an edge of the pixel electrode 191 and the passivation layer 180, and the partition wall 350 has a partition wall opening 351 through which the pixel electrode 191 is exposed. The partition wall 350 may be made of resins, such as polyacrylates resin and polyimides or silica-based inorganic materials.

An organic emission layer 370 is formed on the pixel electrode 191 exposed through the partition wall opening 351, and the common electrode 270, which is a second electrode, is formed on the organic emission layer 370. As described above, the organic light emitting diode 70 including the pixel electrode 191, the organic emission layer 370, and the common electrode 270 is formed.

Herein, the pixel electrode 191 is an anode, which is a hole injection electrode, and the common electrode 270 is a cathode, which is an electron injection electrode. However, the example embodiments according to the present disclosure are not limited thereto, and the pixel electrode 191 may be the cathode and the common electrode 270 may be the anode according to the driving method of the organic light emitting diode display. Holes and electrons are injected from the pixel electrode 191 and the common electrode 270, respectively, into the organic emission layer 370. When excitons in which the injected holes and electrons are combined fall from an excitation state to a ground state, light is emitted.

The organic emission layer 370 is formed of a low molecular weight organic material or a high molecular weight organic material, such as poly 3,4-ethylenedioxythiophene (PEDOT). Further, the organic emission layer 370 may be formed in a multilayer including one or more of an emission layer, a hole injection layer (HIL), a hole transporting layer (HTL), an electron transporting layer (ETL), and an electron injection layer (EIL). In a case where the organic emission layer 370 includes all of the emission layer, the hole injection layer (HIL), the hole transporting layer (HTL), the electron transporting layer (ETL), and the electron injection layer (EIL), the hole injection layer is positioned on the pixel electrode E1, which is the anode, and the hole transporting layer, the emission layer, the electron transporting layer, and the electron injection layer are sequentially stacked on the hole injection layer.

The organic emission layer 370 may include a red organic emission layer for emitting red light, a green organic emission layer for emitting green light, and a blue organic emission layer for emitting blue light. The red organic emission layer, the green organic emission layer, and the blue organic emission layer are formed in a red pixel, a green pixel, and a blue pixel, respectively, to implement a color image.

Further, the organic emission layer 370 may implement the color image by stacking all of the red organic emission layer, the green organic emission layer, and the blue organic emission layer in the red pixel, the green pixel, and the blue pixel together, and forming a red color filter, a green color filter, and a blue color filter for each pixel. In another example embodiment, a white organic emission layer for emitting white light may be formed in all of the red pixel, the green pixel, and the blue pixel, and the red color filter, the green color filter, and the blue color filter may be formed, respectively, for each pixel to form the color image. When the color image is implemented using the white organic emission layer and the color filters, deposition masks for depositing the red organic emission layer, the green organic emission layer, and the blue organic emission layer on the respective pixels, that is, the red pixel, the green pixel, and the blue pixel, may not be necessary or used.

A person of ordinary skill in the art would realize that the white organic emission layer described in the example embodiment may be formed of one organic emission layer, and may even include a constitution in which a plurality of organic emission layers are laminated to emit white light. For example, the white organic emission layer may also include a constitution in which at least one yellow organic emission layer and at least one blue organic emission layer are combined to emit white light, a constitution in which at least one cyan organic emission layer and at least one red organic emission layer are combined to emit white light, or a constitution in which at least one magenta organic emission layer and at least one green organic emission layer are combined to emit white light.

An encapsulation member for protecting the organic light emitting diode 70 may be formed on the common electrode 270, may be sealed by a sealant on the substrate 110, and may be formed of various materials, such as glass, quartz, ceramic, plastics, and metal. However, a thin film encapsulation layer may be formed by depositing an inorganic layer and an organic layer on the common electrode 270, without using the sealant.

While this disclosure has been described in connection with what is presently considered to be practical example embodiments, it is to be understood by a person having ordinary skill in the art that the disclosure is not limited to the disclosed embodiments, but, on the contrary, is intended to cover various modifications and equivalent arrangements included within the spirit and scope of the appended claims, and their equivalents.

| Description of symbols | | | |
|---|---|---|---|
| 110: | Substrate | 121: | Scan line |
| 122: | Previous scan line | 123: | Light emission control line |
| 124: | Initialization voltage line | 128: | Bypass control line |
| 125a: | Driving gate electrode | 125b: | Switching gate electrode |
| 131a: | Driving semiconductor layer | | |
| 132b: | Switching semiconductor layer | | |
| 141: | First gate insulating layer | 142: | Second gate insulating layer |
| 160: | Interlayer insulating layer | 171: | Data line |
| 172: | Driving voltage line | 174: | Connecting member |
| 180: | Passivation layer | 191: | Pixel electrode |
| 370: | Organic emission layer | 270: | Common electrode |

What is claimed is:

1. An organic light emitting diode display, comprising:
a substrate;
a scan line and a previous scan line on the substrate and configured to transmit a scan signal and a previous scan signal, respectively;
a data line and a driving voltage line crossing the scan line and the previous scan line, and configured to transmit a data signal and a driving voltage, respectively;
a switching transistor coupled to the scan line and the data line;
a driving transistor coupled to the switching transistor;

a compensation transistor coupled to one end of the driving transistor and configured to turn on according to the scan signal to compensate a threshold voltage of the driving transistor;

a connecting member configured to couple a compensation semiconductor layer of the compensation transistor to a driving gate electrode of the driving transistor;

a first electrode coupled to another end of the driving transistor;

an organic emission layer on the first electrode; and a second electrode on the organic emission layer, wherein the connecting member and the first electrode are spaced from each other on a planar surface of the substrate.

2. The organic light emitting diode display of claim 1, wherein an outer line of the connecting member and an outer line of the first electrode facing the outer line of the connecting member in the planar surface have an interval therebetween.

3. The organic light emitting diode display of claim 1, further comprising:

a switching semiconductor layer and a driving semiconductor layer at a same layer as that of the compensation semiconductor layer; and a first gate insulating layer, a second gate insulating layer, and an interlayer insulating layer sequentially covering the switching semiconductor layer, the driving semiconductor layer, and the compensation semiconductor layer, wherein the connecting member is on the interlayer insulating layer.

4. The organic light emitting diode display of claim 3, further comprising a storage capacitor comprising:

a first storage capacitive plate on the first gate insulating layer and overlapping the driving semiconductor layer; and a second storage capacitive plate on the second gate insulating layer and overlapping the first storage capacitive plate, wherein the first storage capacitive plate comprises the driving gate electrode.

5. The organic light emitting diode display of claim 4, wherein the data line and the driving voltage line are at a same layer as the connecting member.

6. The organic light emitting diode display of claim 5, wherein:

one end of the connecting member is coupled to the driving gate electrode through a contact hole in the second gate insulating layer and the interlayer insulating layer, and another end of the connecting member is coupled to the compensation semiconductor layer through a contact hole in the first gate insulating layer, the second gate insulating layer, and the interlayer insulating layer.

7. The organic light emitting diode display of claim 6, further comprising:

a passivation layer configured to cover the data line, the driving voltage line, and the connecting member;

a pixel defining layer configured to cover an edge of the first electrode on the passivation layer; and an initialization voltage line at a same layer as that of the first electrode, and configured to initialize the driving transistor, wherein the second storage capacitive plate is located between the driving gate electrode and the first electrode, the second storage capacitive plate covering the driving gate electrode.

8. The organic light emitting diode display of claim 7, further comprising:

an initialization transistor configured to turn on according to the previous scan signal, and configured to transmit an initialization voltage to the driving gate electrode;

a light emission control line at a same layer as that of the scan line and configured to transmit a light emission control signal;

an operation control transistor configured to turn on by the light emission control signal and configured to transmit the driving voltage to the driving transistor; and a light emission control transistor configured to turn on by the light emission control signal and configured to transmit the driving voltage from the driving transistor to the first electrode, wherein a light emission control drain electrode of the light emission control transistor overlaps an extended portion of the first electrode.

* * * * *